United States Patent [19]

Jungert

[11] Patent Number: 5,204,550
[45] Date of Patent: Apr. 20, 1993

[54] OUTPUT STAGE HAVING REDUCED CURRENT CONSUMPTION

[75] Inventor: Horst Jungert, Einberg, Fed. Rep. of Germany

[73] Assignee: Texas Instruments Deutschland GmbH, Fed. Rep. of Germany

[21] Appl. No.: 823,225

[22] Filed: Jan. 21, 1992

[30] Foreign Application Priority Data

Jan. 23, 1991 [DE] Fed. Rep. of Germany ....... 4101906

[51] Int. Cl.$^5$ .................. H03K 5/12; H03K 5/153
[52] U.S. Cl. ............................ 307/263; 307/354; 307/454; 307/455; 307/547; 307/548
[58] Field of Search .................... 307/300, 263–264, 307/268, 350, 354, 454–455, 546–548

[56] References Cited

U.S. PATENT DOCUMENTS 4,394,588  7/1983  Gaudenzi .................. 307/263
4,800,298  1/1989  Yu et al. .................. 307/548
5,036,222  7/1991  Davis ...................... 307/548
5,059,824 10/1991  Ueno ....................... 307/263
5,087,834  2/1992  Tsay ....................... 307/263

Primary Examiner—William L. Sikes
Assistant Examiner—Margaret Rose Wanbach
Attorney, Agent, or Firm—William E. Hiller; Richard L. Donaldson

[57] ABSTRACT

An output stage for a digital circuit for emitting a signal with the one or the other binary value in dependence upon an input signal includes an output transistor at the collector of which the signal to be emitted can be tapped off and to the base of which a current dependent on the input signal is supplied. In the line leading to the base of the output transistor, a device is disposed for setting the base current in dependence upon the current flowing through the collector-emitter path of the output transistor.

6 Claims, 3 Drawing Sheets

OUTPUT STAGE HAVING REDUCED CURRENT CONSUMPTION

The invention relates to an output stage for a digital circuit for emitting a signal with the one or the other binary value in dependence upon an input signal, comprising an output transistor at the collector of which the signal to be emitted can be tapped off and to the base of which a current dependent on the input signal is supplied.

In a known output stage of this type, in the base line of the output transistor there is a resistance which is so dimensioned that a predetermined desired base current flows. This base current always flows even when no load has to be driven by the output transistor. Such output stages are used for example in bus driver circuits in which depending upon the nature of the bus system to be driven 8 or 16 output stages are present. In these uses, even when a load driving is not necessary at any bus line a current flows which is 8 or even 16 times the value of the current of a single output stage. This problem cannot be solved by a general reduction of the base current of the output transistor because this could greatly impair the switching speed of the transistor on changing from the nonconductive state to the conductive state as is necessary on changing from a high output voltage level to a low output voltage level.

The invention is based on the problem of providing an output stage of the type set forth at the beginning of which the current consumption is reduced without impairing the switching speed.

This problem is solved according to the invention in that in the line leading to the base of the output transistor a device is disposed for setting the base current in dependence upon the current flowing through the collector-emitter path of the output transistor.

In the output stage according to the invention the current supplied to the base of the output transistor is set by the current flowing through said output transistor, which is equal to the load current. This results in a requirement-dependent setting of the base current so that when there is no need for a high base current a reduction can be made which leads to a considerable reduction of the current consumption of the output stage in the rest state.

Advantageous further developments of the invention are characterized in the subsidiary claims. According to one embodiment, the current setting can be made by means of a resistance variable in dependence upon the current. In another embodiment, the adjustment can be carried out with the aid of a controllable current source.

The invention will now be explained by way of example with the aid of the drawings, wherein.

Figure 1A:
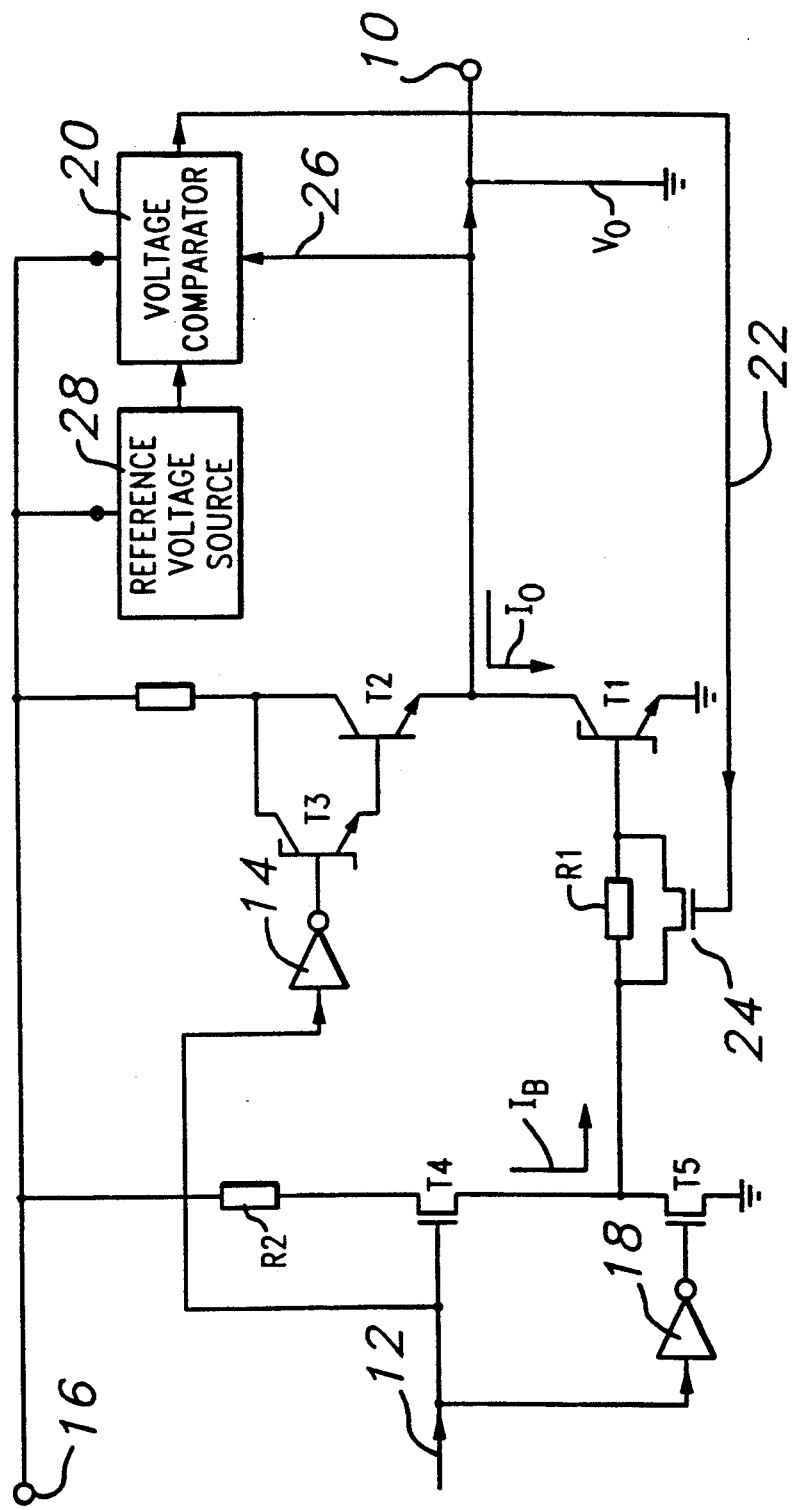
FIG. 1A shows an embodiment of an output stage according to the invention.

The output stage illustrated in FIG. 1A includes a bipolar output transistor T1 cooperating in push-pull mode with a further bipolar transistor T2 forming a Darlington circuit with a bipolar transistor T3. The output signal of the output stage is emitted at an output 10 which is connected to the collector of the transistor T1 connected to the emitter of the transistor T2.

The input signal of the output stage coming from an input 12 is supplied to the transistors T1 and T2, T3, operating in push-pull manner, on the one hand via a field-effect transistor T4 and a base resistor R1 and on the other via an inverter 14. The base current for the transistor T1 can flow via a path which leads from a supply voltage terminal 16, a resistor R2, the field-effect transistor T4 to the resistor R1. The further structure of the circuit of FIG. 1A will be apparent from the following description of the mode of operation thereof.

The circuit of FIG. 1A is part of a digital circuit generating binary signals having the one or other binary value. These binary values are usually denoted as "H" or "L", depending on whether the associated voltage value is high or low. At the circuit point 12 which is the input of the output stage illustrated in FIG. 1A the particular binary value is present in the form of a high or a low voltage and the purpose of the output stage is to generate this signal value at the output 10 as well but at the same time to supply the current $I_O$ for driving the load connected to the output 10. The load may for example be a busline which is connected to the output 10. For switching over the voltage value at the output 10 the transistor T1 is put by the signal at the input 12 into the conductive or nonconductive state. If for example it is assumed that the signal at the input 12 has a high voltage value then the field-effect transistor T4 will be put into the conductive state thereby whereas the field-effect transistor T5 driven via the inverter 18 is put into the nonconductive state. In this state current can flow via the resistor R2 and the resistor R1 to the base of the transistor T1 so that the output transistor T1 goes into the conductive state. This causes the voltage at the output 10 to change to the low voltage value, i.e. assume the binary value "L". In this state, by the driving via the inverter 14 the transistors T3 and T2 are simultaneously rendered nonconductive so that a load current can flow via the collector-emitter path of the transistor T1. With the modules of the output stage of FIG. 1A described hitherto the magnitude of the base current of the output transistor T1 is invariable; it depends solely on the value of the supply voltage at the supply voltage terminal 16, the value of the resistors R1 and R2 and the base voltage of the transistor T1. With the aid of the modules of the output stage still to be described the base current of the output transistor T1 is reduced to a lower value in order to reduce the current consumption in the rest state, i.e. whenever the load connected to the output 10 does not require any drive current.

The output transistor T1 is traversed in the output stage of FIG. 1A by the load current $I_O$. The voltage $V_O$ appearing at the collector thereof is the current-dependent voltage drop across the collector-emitter path of the transistor T1. Thus, if the load at the output 10 does not require any current the voltage $V_O$ has a low value whilst it increases with increasing current requirement of the load. The particular voltage present at the output 10 can be utilized to switch over the base current of the output transistor T1.

For this purpose, in the output stage of FIG. 1A a control signal depending on the magnitude of the voltage at the output 10 is generated by a voltage comparator 20. Said control signal is supplied via a line 22 to the gate of a field-effect transistor 24, the source-drain path of which is connected in parallel to the resistor R1. Due to this connection, the low resistance value which the field-effect transistor 24 has when it is put into the conductive state due to the control signal applied to its gate is connected in parallel with the ohmic resistor R1 which has a fixed resistance value. In contrast, in the nonconductive state of the field-effect transistor 24 the resistor R1 is effective with its full resistance value in the base line of the transistor T1. This means that depending on the control signal supplied to the field-effect transistor 24 the resistance value in the base line of the transistor T1 can be varied so that it is thereby possible to influence the base current of said transistor T1.

The voltage comparator 20, to which via the line 26 the voltage $V_O$, i.e. the output voltage at the output 10, is supplied compares said voltage value with a reference voltage from a reference voltage source 28 which derives the fixed reference voltage from the supply voltage at the line 16. If the voltage $V_O$ at the output 10 is smaller than the reference voltage the voltage comparator 20 passes to the line 22 a voltage value as a control signal which renders the field-effect transistor 24 nonconductive. As a result, the resistor R1 is effective with its full resistance value and consequently only a low base current can flow to the output transistor T1. The low value of the voltage $V_O$ occurs when only a small current flows through the transistor T1, i.e. the load connected to the output 10 does not require any drive current $I_O$. If on the other hand the current $I_O$ required by the load at the output 10 rises this also leads to a rise in the voltage $V_O$. As soon as the value of the voltage $V_O$ rises above the value of the reference voltage from the reference voltage source 28 the signal emitted by the voltage comparator 20 effects a switching of the field-effect transistor 24 to a low resistance state so that the parallel circuit of the resistor R1 and the field-effect transistor 24 leads to a pronounced decrease of the resistance in the base line of the transistor T1. Accordingly, a higher base current as required to satisfy the current need of the load connected to the output 10 can flow to the transistor T1.

Thus, with the circuit described here it is possible to automatically switch the base current of the transistor T1 between two values, that is the value resulting when in the base line of the transistor T1 the resistor R1 is effective with its full value because the field-effect transistor 24 is rendered nonconductive, and the value which results when in the base line of the transistor T1 the parallel circuit of the resistor R1 and the conductive field-effect transistor 24 is effective as resistance.

Figure 1B:
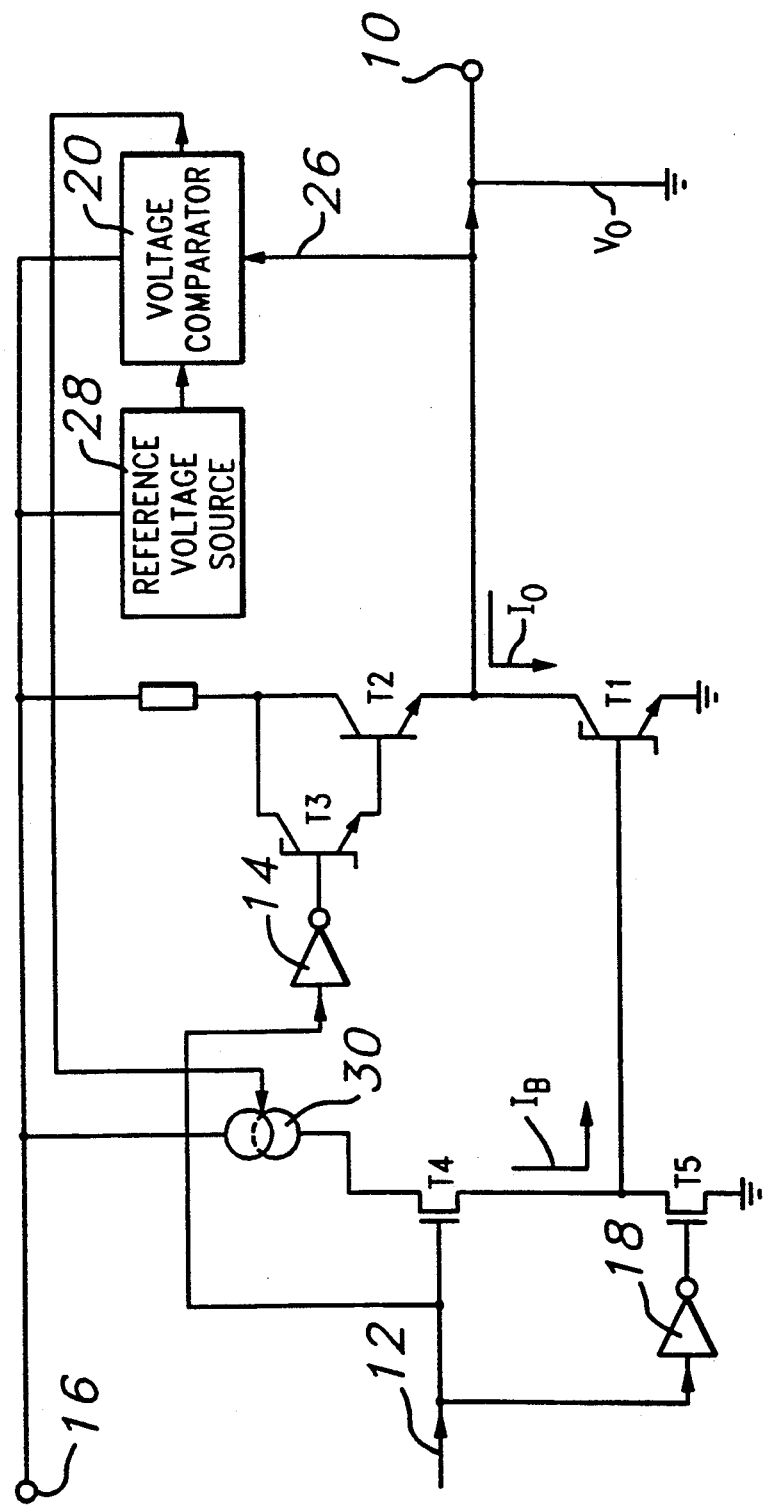
FIG. 1B shows another embodiment of an output stage according to the invention.

Another possibility for changing the base current in dependence upon the value of the voltage $V_O$ resides in that a controllable current source having a current output value controlled by the output signal of the voltage comparator 20 maybe inserted into the base line of the transistor T1, at best at the point at which the resistor R2 is disposed in the circuit of FIG. 1A. In FIG. 1B, another embodiment of the output stage is illustrated in which this current source 30 is shown as an alternative to the embodiment described above. With this alternative construction as well the base current of the transistor T1 can be controlled in dependence upon the voltage $V_O$.

In the circuit described in FIG. 1A, it is also ensured that the switching speed on changing the output signal from the high binary value "H" to the low binary value "L" is not impaired. For if due to the signal at the input 12 the binary value at the output 10 is switched to the high signal value "H", the voltage $V_O$ lies at a value which causes the voltage comparator 20 to put the field-effect transistor 24 into the conductive state by supplying a corresponding control signal. As a result, at the transistor T1 the maximum base current is available and consequently a subsequent switching from the binary value "H" to the binary value "L" can take place at high speed.

Figure 2:
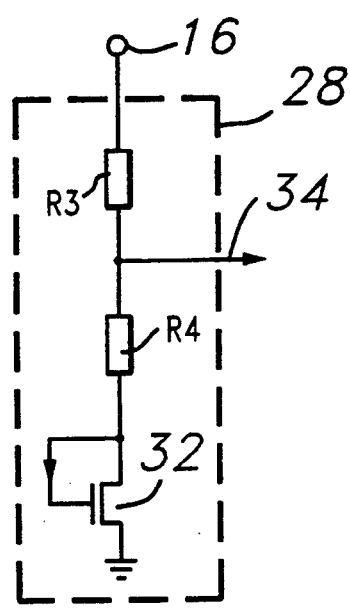
FIG. 2 shows a possible configuration of a reference voltage source for the output stage of FIGS. 1A and 1B.

In FIG. 2 an example of an embodiment of a reference voltage source 28 is illustrated. Said reference voltage source 28 includes a voltage divider comprising two resistors R3 and R4 which lie in series between the supply voltage terminal 16 and ground. Also present between the resistor R4 and ground is a field-effect transistor 32 which shifts the value of the voltage tapped from the connection point of the two resistors R3 and R4 by the value of its threshold voltage. This shifting by the value of a threshold voltage is required for compensation of a similar voltage shift in the voltage comparator 20, as will be explained below. The reference voltage source 28 generates the voltage with which the voltage at the output 10 of the output stage is compared in the voltage comparator 20. The reference voltage source 28 emits this reference voltage at the output 34.

Figure 3:
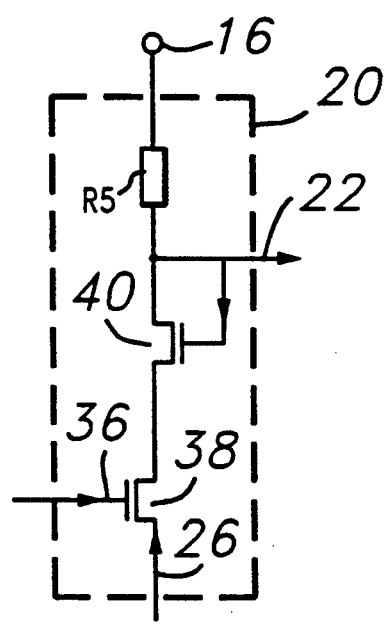
FIG. 3 shows a configuration of a voltage comparator for generating a control signal required in the output stage of FIGS. 1A and 1B.

An example of an embodiment of the voltage comparator 20 is illustrated in FIG. 3. The voltage comparator 20 receives at its input 36 the reference voltage furnished by the output 34 of the reference voltage source 28. Said reference voltage is supplied to the gate of a field-effect transistor 38. The field-effect transistor 38 is connected in series with a further field-effect transistor 40 which in turn is connected in series with a resistor R5 which is connected to the supply voltage terminal 16. The output voltage $V_O$ of the output stage is supplied via the line 26 to the voltage comparator 20. If said voltage lies beneath the value of the reference voltage at the input 36 the two field-effect transistors 38 and 40 are conductive so that the control signal supplied to the line 22 also has a low value and puts the field-effect transistor 24 of the output stage into the nonconductive state. This blocking results in the resistor R1 in the base line of the output transistor T1 becoming effective with its full value and holding the base current at a low value. This achieves the desired energy saving effect.

If on the other hand the output voltage $V_O$ at the output 10 of the output stage rises to a value lying above the value of the reference voltage at the input 36 the field-effect transistors 38 and 40 become conductive so that via the line 22 the high voltage value puts the field-effect transistor 24 into the conductive state so that the base current of the output transistor T1 can rise to a higher value. The threshold voltage of the transistor 38 by which the voltage $V_O$ is shifted on performing the voltage comparison in the voltage comparator 20 is compensated by the threshold voltage of the field-effect transistor 32 in the reference voltage source 28. Since a threshold voltage also appears at the field-effect transistor 24 of the output stage, in the voltage comparator 20 the field-effect transistor 40 is used which with its threshold voltage compensates the threshold voltage at the field-effect transistor 24. The output stage described thus has the property of reducing the energy consumption when the load driven by the output stage does not require any driving current. This saving in current is considerable particularly when the output stage is used in a bus driver circuit in which 8 or even 16 such output stages are operated in parallel. In this case, for each output stage of the types illustrated in FIGS. 1A and 1B, a respective voltage comparator 20 is then present, all the voltage comparators being supplied from a reference voltage source 28 with the corresponding reference voltage.

I claim:

1. A digital output circuit comprising:
   an input terminal for receiving a binary input signal;
   an output terminal for providing a binary output signal;
   a power source terminal for providing a supply voltage;
   a bipolar output transistor having a collector, an emitter and a base;
   the collector of said bipolar output transistor being connected to said output terminal and to said power source terminal, the emitter of said bipolar output transistor being connected to ground, and the base of said bipolar output transistor being connected to said power source terminal;
   means operably connected to said output terminal for generating a control signal having a magnitude dependent upon the magnitude of the voltage at the output terminal;
   a first field-effect transistor connected between said power source terminal and the base of said bipolar output transistor and having a control gate connected to said input terminal;
   a resistor interposed between said first field-effect transistor and the base of said bipolar output transistor and respectively connected thereto; and
   a second field-effect transistor having a source-drain path connected in parallel with said resistor and a control gate connected to said control signal-generating means, the control gate of said second field-effect transistor being responsive to the control signal at a magnitude equal to or above a predetermined threshold to render said second field-effect transistor conductive for decreasing the resistance value of said resistor to enable the base current applied to the base of said bipolar output transistor to increase, thereby rendering said bipolar output transistor conductive.

2. A digital output circuit as set forth in claim 1, further including a reference voltage source for providing a reference voltage connected to said control signal-generating means, each of said control signal-generating means and said reference voltage source being connected to said power source terminal;
   said control signal-generating means being responsive to the magnitude of the voltage at said output terminal as compared to the reference voltage provided by said reference voltage source in generating the control signal;
   the control signal being below the predetermined threshold when the voltage at said output terminal is less than the reference voltage from said reference voltage source so as to render said second field-effect transistor nonconductive; and
   the control signal being at least equal to said predetermined threshold when the voltage at said output terminal exceeds the reference voltage from said reference voltage source so as to render said second field-effect transistor conductive.

3. A digital output circuit as set forth in claim 1, wherein said bipolar output transistor is included in an output stage;
   said output stage further including second and third bipolar transistors respectively having a collector, an emitter and a base and arranged in a Darlington configuration with the emitter of said second bipolar transistor being connected to said output terminal and to the collector of said bipolar output transistor, the collector of said second bipolar transistor being connected to said power source terminal, and the base of said second bipolar transistor being connected to the emitter of said third bipolar transistor;
   the base of said third bipolar transistor included in said output stage being connected to said input terminal; and
   an inverter interposed between the base of said third bipolar transistor and said input terminal and respectively connected thereto.

4. A digital output circuit as set forth in claim 3, further including a reference voltage source for providing a reference voltage connected to said control signal-generating means, each of said control signal-generating means and said reference voltage source being connected to said power source terminal;
   said control signal-generating means being responsive to the magnitude of the voltage at said output terminal as compared to the reference voltage provided by said reference voltage source in generating the control signal;
   the control signal being below the predetermined threshold when the voltage at said output terminal is less than the reference voltage from said reference voltage source so as to render said second field-effect transistor nonconductive; and
   the control signal being at least equal to said predetermined threshold when the voltage at said output terminal exceeds the reference voltage from said reference voltage source so as to render said second field-effect transistor conductive.

5. A digital output circuit comprising:
   an input terminal for receiving a binary input signal;
   an output terminal for providing a binary output signal;
   a power source terminal for providing a supply voltage;
   a bipolar output transistor having a collector, an emitter and a base;
   the collector of said bipolar output transistor being connected to said output terminal and to said power source terminal, the emitter of said bipolar output transistor being connected to ground, and the base of said bipolar output transistor being connected to said power source terminal;
   means operably connected to said output terminal for generating a control signal having a magnitude dependent upon the magnitude of the voltage at the output terminal;
   a variable current source connected between the output of said control signal-generating means and the base of said bipolar output transistor and having a current output magnitude dependent upon the control signal as output by said control signal-generating means; and
   said bipolar output transistor being rendered conductive in response to the voltage at said output terminal being at a level enabling said control signal-generating means to generate a control signal at a magnitude equal to or above a predetermined threshold such that said variable current source provides a base current to the base of said bipolar output transistor in response to the control signal from said control signal-generating means of increased magnitude enabling current to flow from said output terminal through the collector-emitter path of said bipolar output transistor.

wherein said digital output circuit further includes a reference voltage source for providing a reference voltage connected to said control signal-generating means, each of said control signal-generating means and said reference voltage source being connected to said power source terminal;

said control signal-generating means being responsive to the magnitude of the voltage at said output terminal as compared to the reference voltage provided by said reference voltage source in generating the control signal;

the control signal being below the predetermined threshold when the voltage at said output terminal is less than the reference voltage from said reference voltage source such that said variable current source provides a first base current to the base of said bipolar output transistor of a relatively low magnitude; and the control signal being at least equal to said predetermined threshold when the voltage at said output terminal exceeds the reference voltage from said reference voltage source such that said variable current source provides a second base current to the base of said bipolar output transistor of a relatively high magnitude as compared to said first base current.

6. A digital output circuit as set forth in claim 5, wherein said bipolar output transistor is included in an output stage;

said output stage further including second and third bipolar transistors respectively having a collector, an emitter and a base and arranged in a Darlington configuration with the emitter of said second bipolar transistor being connected to said output terminal and to the collector of said bipolar output transistor, the collector of said second bipolar transistor being connected to said power source terminal, and the base of said second bipolar transistor being connected to the emitter of said third bipolar transistor;

the base of said third bipolar transistor included in said output stage being connected to said input terminal; and an inverter interposed between the base of said third bipolar transistor and said input terminal and respectively connected thereto.

* * * * *